United States Patent
Tokmulin et al.

(10) Patent No.: US 6,845,733 B1
(45) Date of Patent: Jan. 25, 2005

(54) DEVICE FOR TREATING PLANAR ELEMENTS WITH A PLASMA JET

(75) Inventors: Iskander M. Tokmulin, Bethel, CT (US); Igor P. Bagriy, Bethel, CT (US); Boris M. Balats, Moscow (RU); Alexei B. Virovets, Southbury, CT (US); Vyacheslav G. Shamshurin, Lobnya (RU)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 08/860,763

(22) PCT Filed: Apr. 11, 1995

(86) PCT No.: PCT/RU95/00063

§ 371 (c)(1),
(2), (4) Date: Sep. 9, 1998

(87) PCT Pub. No.: WO96/21943

PCT Pub. Date: Jul. 18, 1996

(30) Foreign Application Priority Data

Jan. 13, 1995 (RU) .......................................... 95100180

(51) Int. Cl.[7] .......................... C23C 16/513; C23F 1/00; H01L 21/306
(52) U.S. Cl. .................... 118/723 R; 118/730; 118/320; 156/345.31; 156/345.32; 156/345.54; 156/345.55
(58) Field of Search ........................ 427/527; 414/217; 118/724, 730, 723 R, 723 E, 720; 269/21; 156/345.55; 204/192.11

(56) References Cited

U.S. PATENT DOCUMENTS

| | | | |
|---|---|---|---|
| 3,278,796 A | | 10/1966 | Takei et al. ............. 315/111.41 |
| 4,222,345 A | * | 9/1980 | Bergfelt et al. ............. 118/720 |
| 4,343,830 A | * | 8/1982 | Sarma et al. ................. 438/92 |
| 5,077,888 A | * | 1/1992 | Tokisue et al. ............... 29/467 |
| 5,106,346 A | * | 4/1992 | Locher et al. ................. 475/11 |
| 5,204,145 A | * | 4/1993 | Gasworth ..................... 427/577 |
| 5,273,588 A | * | 12/1993 | Foster et al. ............. 118/723 E |
| 5,308,461 A | * | 5/1994 | Ahonen ................. 204/192.11 |
| 5,539,176 A | * | 7/1996 | Ikegaya et al. ......... 219/121.59 |
| 5,613,821 A | * | 3/1997 | Muka et al. ................. 414/217 |
| 5,820,686 A | * | 10/1998 | Moore ......................... 118/730 |
| 5,838,528 A | * | 11/1998 | Os et al. ...................... 361/234 |
| 5,886,864 A | * | 3/1999 | Dvorsky ..................... 361/234 |
| 6,139,678 A | * | 10/2000 | Siniaguine ............. 156/345.55 |
| 6,168,697 B1 | * | 1/2001 | Siniaguine et al. .... 204/298.15 |
| 6,467,297 B1 | * | 10/2002 | Bollinger et al. ............. 62/404 |

FOREIGN PATENT DOCUMENTS

| | | | | |
|---|---|---|---|---|
| JP | S55-134175 | | 10/1980 | |
| JP | H02-312256 | | 12/1990 | |
| JP | H04-130187 | | 11/1992 | |
| JP | H5-33534 | * | 4/1993 | ........... H01L/21/68 |
| JP | H05-033534 | | 4/1993 | |
| JP | H05-038569 | | 6/1993 | |
| JP | H05-179428 | | 7/1993 | |
| JP | 4-124092 | * | 4/1994 | ........... C30B/29/04 |
| WO | WO 92/21220 | | 11/1992 | |

* cited by examiner

Primary Examiner—Rudy Zervigon
(74) Attorney, Agent, or Firm—Myron Greenspan, Esq.; Lackenbach Siegel, LLP

(57) ABSTRACT

The invention relates to the technical field of plasma treatment of planar elements such as plates, sheets and wafers in electronics and electrical engineering, and in essence is a device for treating wafers with a plasma jet. The device comprises the following elements mounted in a closed chamber: a drive that effects angular displacement of the holders, which are provided with a common rotary drive, a plasma jet generator, and, mounted outside the closed chamber a manipulator and storage devices for the wafers. The wafer to be treated is picked up by the manipulator from the storage device and placed in the holder which together with the wafer passes over the plasma jet generator used for the treatment. The cycle may be repeated a predetermined number of times.

14 Claims, 3 Drawing Sheets

US 6,845,733 B1

DEVICE FOR TREATING PLANAR ELEMENTS WITH A PLASMA JET

BACKGROUND OF THE INVENTION

1. Field of the Invention

The present invention relates to the field of plasma technology and may be used in electronics and electrical engineering when treating planar elements, for example, semiconductor wafers, substrates, printed circuit boards, compact disks and other products.

2. Description of the Related Art

There has long been known a device for studying a plasma-surface interaction, a device that comprises a plasma generator, a power source therefor, a system for the plasma generator displacement, a system for displacing samples, a gas distribution system and a control system (see, *Theses of the Reports at the 10th All-Union Conference*, P. P. Kulik et al., "Low-Temperature Plasma Generators," Part II, Minsk, ITMS Publishers, Academy of Sciences of Byelorussian Soviet Socialist Republic, 1986, p. 135). However, this device has a number of disadvantages.

The absence of a quick-operating loading-unloading system results in a large expenditure of time and, hence, plasma generator energy that is consumed to no purpose when plates-samples to be treated are replaced. The inability to simultaneously treat several plates-samples, one right after another, decreases the output of the device.

The fact that there are present in this device a number of control and measuring means that inhibit any repeated treatment of samples according to a rigidly prescribed cycle, unambiguously defines this device as one purely for research.

Taken together, the above-mentioned features result in the fact that the device cannot be used under conditions of series production.

The closest prior art has been described in International Application No. WO 92/21220, H05H 1/40, 1992, which discloses a device for treating wafers with a plasma jet, comprising a plasma jet generator; gas supplying means; a set of holders for wafers to be treated, said holders being structurally made in the form of a turntable having a drive for effecting angular displacement thereof and for facing a generator plasma jet turned downwards; each of the holders being made in the form of a horizontal platform mounted for rotation about the axis passing through the center thereof and being perpendicular to the plane of said platform; and said plasma jet and wafer holder having the possibility of being displaced with respect to each other in the direction of at least one axis of coordinates and of being in or out of contact with each other.

The main drawbacks associated with this device include an underproductivity created by the large number of manual operations necessary when loading-unloading the wafers to be treated. In addition, the wafers treated are inferior in quality due to the possibility of surface damage when contact-attaching in the holder.

Moreover, the direction of the plasma jet from top to bottom necessitates taking the measure of the cooling of the plasma generator from overheating caused by upwardly moving hot gases formed during operation of the plasma generator.

SUMMARY OF THE INVENTION

The application according to the present invention provides a device for treating wafers with a plasma jet, comprising a plasma jet generator, gas supplying means and a set of holders for wafers to be treated. The holders have a drive for effecting angular displacement of the wafers and face a generator plasma jet. Each of the holders is made in the form of a horizontal platform to rotate about the axis passing through the geometric center thereof and perpendicular to a plane of said platform. Said plasma jet and wafer holder can be displaced with respect to each other in the direction of at least one axis of coordinates, and they may be in or out of contact with each other. The device further comprises a manipulator, storage devices for the wafers to be treated, and a closed chamber having a gas exchange system with the wafer holders and a plasma jet generator located inside said chamber in such a way that a plasma jet is directed from bottom upwards in respect of a plane of locating horizontal platforms of said wafer holders. The closed chamber is provided with a window in which a movable shutter is installed. The manipulator is located in such a way that it contacts said storage devices directly and with said wafer holder indirectly, through the chamber window. Each of the wafer holders is provided with a limiter at the edges and has its horizontal platform provided with at least three vortex chambers and three tangential channels perpendicular to a plane of said horizontal platform. Each of these vortex chambers is provided with an open portion located on a level end surface of the wafer holder, coupled through a tangential channel to the gas supplying means and located in such a way that the vortex flows that are formed make possible the positioning of the platform near the holder and the cooling of its individual areas to equalize, over the wafer surface, the amount of energy used for treatment thereof. The limiters on the wafer holder platforms are fabricated so that the rods are mounted at an angle $\alpha > 90°$ to the plane of said horizontal platform of the wafer holder. In so doing, their length, 1, is chosen such that $$2l \sin(\alpha > 90°) > \Delta,$$

where $\Delta$ denotes a maximum deviation from axisymmetric arrangement of the treated wafers in said storage devices.

The proposed device in accordance with the present invention achieves its technical results because it contains the following features:

(1) It provides the device with a common rotary drive for the holders, with this drive mounted inside the closed chamber and having its actuating mechanism connected to each of the holders. This drive greatly enhances the output of the device.

(2) It introduces a manipulator, with storage devices for the wafers to be treated, which makes it possible to further enhance the treatment capacity while reducing the time needed for loading-unloading the wafers.

(3) It further introduces a wafer holder with at least three vortex chambers and three tangential channels with the axes of said vortex chambers perpendicular to the horizontal platform of the holder, where each of said vortex chambers being coupled to the tangential channel connected to the gas supplying means. This permits the stable positioning of the wafer to be treated in the vicinity of the holder with a gas gap without touching the wafer and the holder, which, in turn, makes it possible to upgrade treatment quality due to the absence of the touch traces (scratches).

(4) It arranges each of the vortex chambers in the holder such that vortex flows formed by said vortex chambers make possible the fulfillment, at each side of the wafer surface, of the condition $$Q_0 = Q_1 + Q_2,$$

where:

$Q_0$ = a constant—an amount of energy for heating the wafer in the given site;

$Q_1$—an amount of energy received by the given site of the wafer surface with due regard to thermal transparency thereof;

$Q_2$—an amount of energy available at the expense of interaction with a material of the wafer surface in the given site.

This makes it possible to produce more uniform and, hence, higher-quality treatment of the wafer. This result is based on fact that each vortex chamber, when creating a gas vortex, permits not only the positioning of the wafer near the holder but also the cooling of individual areas of the wafer to be treated. Since in the process for treatment, different sites on the surface of the wafer to be treated are originally under different thermal conditions, then the energy balance caused by these vortex flows make possible the establishment of conditions that equalize $Q_0$ at all sites of the wafer.

(5) It uses limiters on the holders in the rods mounted at an angle $\alpha > 90°$ to the horizontal platform of the holder, with their length 1 chosen such that $$2l \sin(\alpha > 90°) > \Delta,$$

where $\Delta$ denotes a maximum deviation from axisymmetric arrangement of the wafers in said storage devices and creates the possibility of the accuracy needed when loading-unloading the wafers, without using additional centering means.

BRIEF DESCRIPTION OF THE DRAWINGS

Other objects and advantages of the invention will become apparent from the following description, when taken in connection with the accompanying drawings, in which.

DESCRIPTION OF A PREFERRED EMBODIMENT

Figure 1:
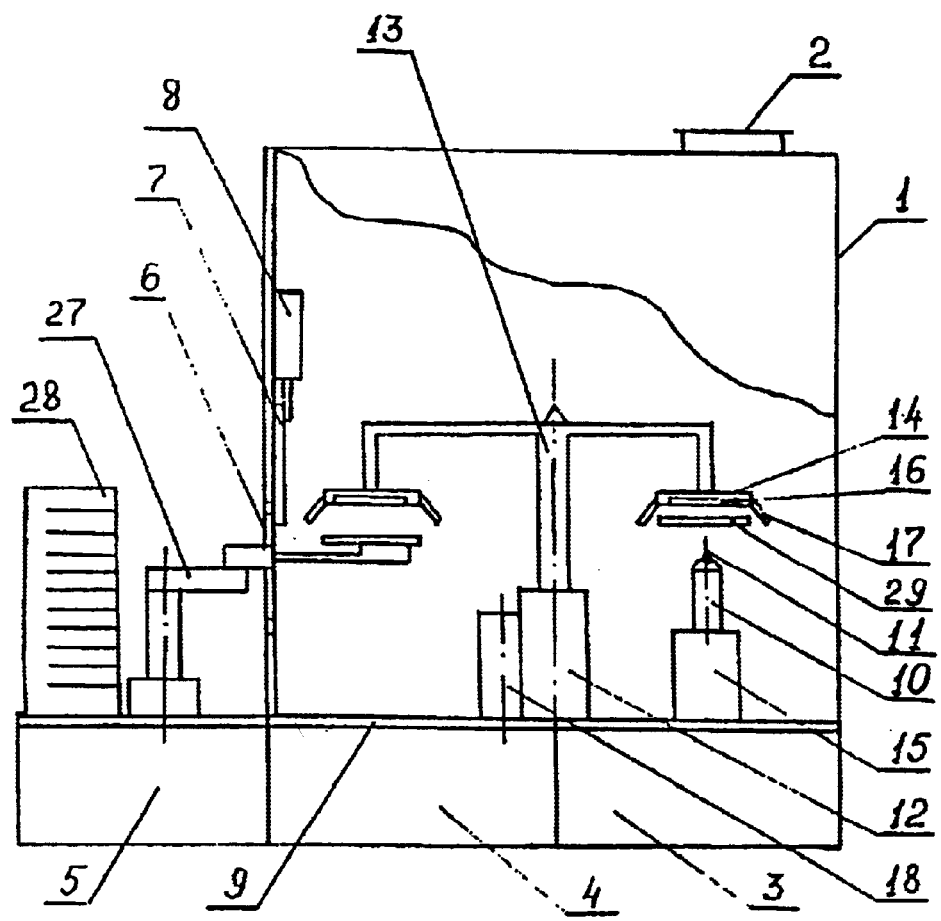
FIG. 1 is a view showing a device for treating wafers with a plasma jet.
Figure 2:
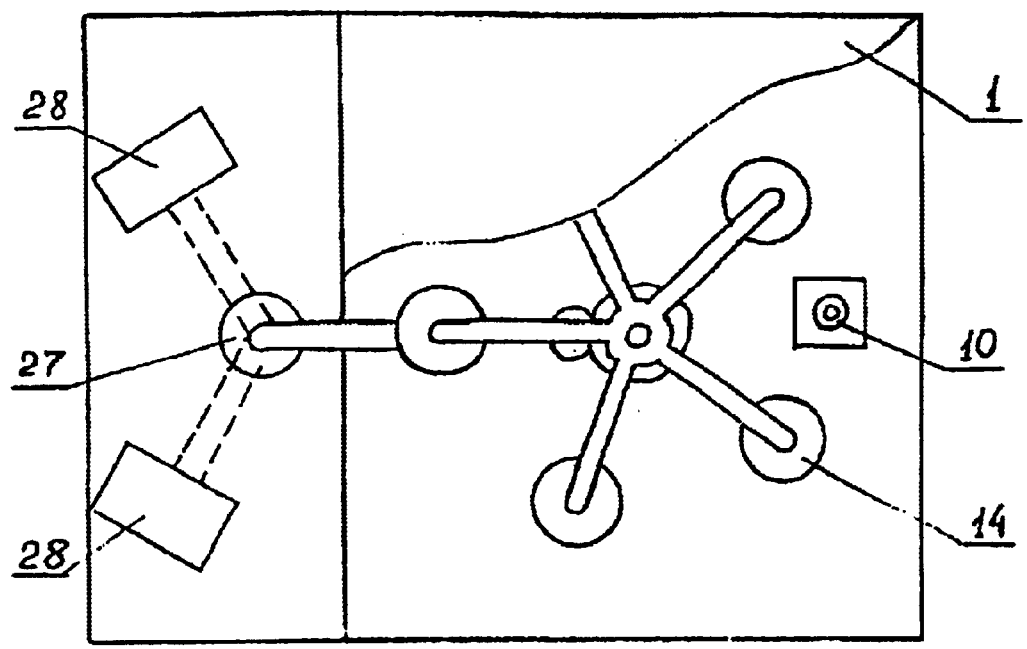
FIG. 2 is a "breakaway" top plan view of FIG. 1.
Figure 3:
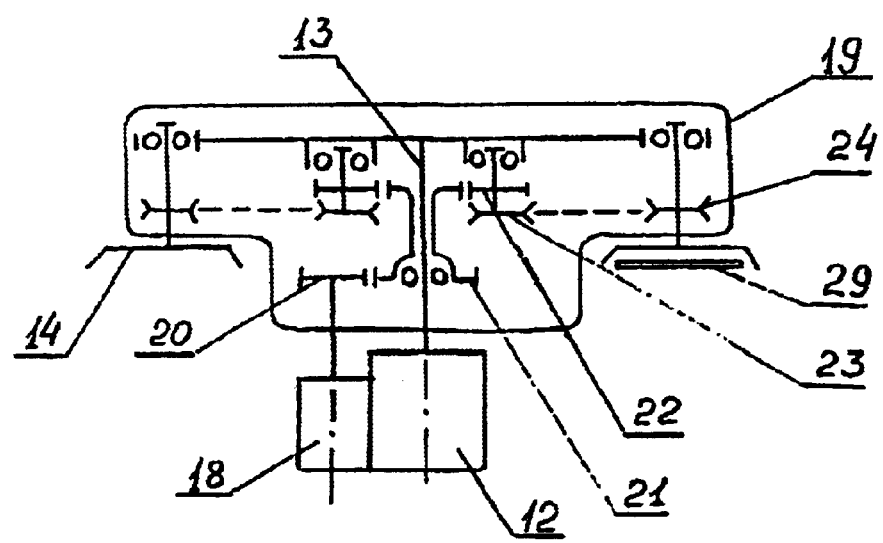
FIG. 3 is a functional diagram of an actuating mechanism of a common rotary drive for holders.
Figure 4:
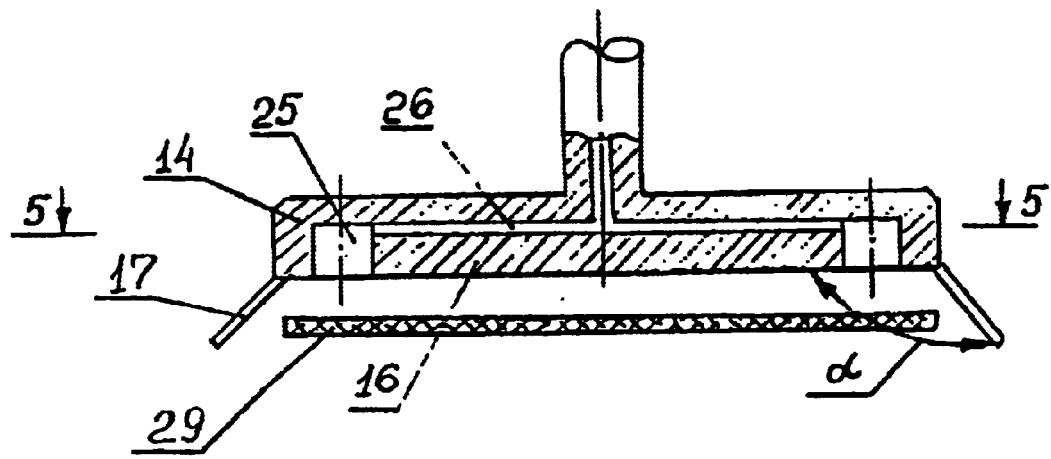
FIG. 4 is a view showing a wafer holder.
Figure 5:
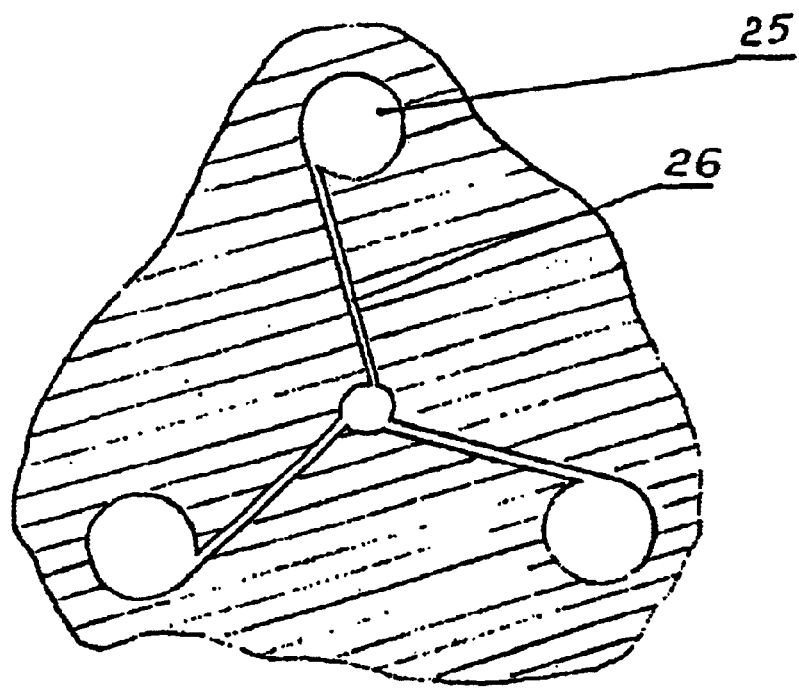
FIG. 5 is a sectional view along line 5—5 of FIG. 4.

FIGS. 1, 2 illustrate a device for treating wafers with a plasma jet, comprising a closed chamber 1; a gas exchange system 2; a power supply unit 3; gas supplying means 4; and a control system 5. The closed chamber 1 is provided with a window 6 in which a movable shutter 7 with a drive 8 is installed. Inside the closed chamber 1, on a base 9, a generator 10 of a plasma jet 11 and an angular displacement drive 12 with its upright shaft 13 coupled to holders 14 are located. The generator 10 of the plasma jet 11 facing the holders 14 is mounted on the base 9 on a support 15 adjustable for height such that the axis of the plasma jet 11 and respective axes of each of the holders 14 are equidistant from the axis of the upright shaft 13 of the angular displacement drive 12. Referring to FIG. 4, the holders 14 are made in the form of horizontal platforms 16 with limiters 17. Said limiters 17 are fabricated as the rods, for example, cylindrical rods. With reference to FIG. 3, horizontal platforms 16 are set in rotation about their axes by a drive 18, for example, by means of an actuating mechanism 19 through a step-by-step interaction of its gears 20, 21, 22 and pulleys 23, 24. In FIGS. 4 and 5, the horizontal platforms 16 are provided with vortex chambers 25 each having an open portion located on a level end surface of the holder 14 and coupled to a tangential channel 26 connected to said gas supplying means 4. In FIG. 1, outside the closed chamber 1, on the base 9, a manipulator 27 and storage devices 28 for wafers 29 are mounted.

The device operates as follows.

In the initial state, one of the storage devices 28 is provided with wafers 29, while the other is free from the wafers. The manipulator 27 grips a bottom wafer 29 in the storage device 28 and transports it through a window 6 (with a shutter 7 opened by a drive 8) into the closed chamber 1. At this moment, the first of the holders 14 is being loaded. The manipulator 27 conveys the wafer 29 into a position below the horizontal platform 16 of the first holder 14.

By switching on the gas supplying means 4 in the vortex chamber 25 and the channel 26, of the holder 14, gas vortex flows are generated for the positioning/maintaining of the wafer 29 at a distance of about 0.5–1.0 mm from the level end surface of the platform 16 of the holder 14. At that moment, the manipulator 14 releases the wafer 29. The wafer is now loaded. Thereupon, the next wafer is loaded.

In the embodiment illustrated here, a device for treating wafers with a plasma jet is provided with five wafer holders angularly displaced at an angle of 72° to one another in the horizontal plane. Feeding the next holder in the loading zone is performed with an angular displacement drive 12 for the holder 14.

Once all the holders are loaded, the manipulator 27 is withdrawn from the closed chamber 1 while closing the shutter 7 with the drive 8. The required gas is then supplied to the chamber. By means of the support 15, the generator 10 of the plasma jet 11 is mounted, with respect to the surface of the wafer 29 to be treated, at a height suitable for manufacture. On switching the drive 18, the holders 14 start to rotate about their axes, together with the wafers 29. Simultaneously, the control system 5 is used to regulate the dynamics of the wafer movement. The generator 10 of the plasma jet 11 and the angular displacement drive 12 are switched and treatment is performed.

After a prescribed number of contacts of the wafer 29 with the plasma jet 11 of the generator 10, the drive 12 is brought to a halt, under the predetermined program from the control system 5, so that non of the wafers 29 in the holders 14 falls within the zone of action of the generator plasma jet. The drive 18 and the generator 10 are then turned off.

The cycle may then be repeated with the next batch of wafers.

Various modifications may be made to this device and to this embodiment without departing from the spirit or scope of the general inventive concept as defined by the appended claims.

What is claimed is:

1. A device for treating wafers with a plasma jet, comprising a plasma jet generator; gas supplying means; a set of holders for wafers to be treated, said holders having a drive for effecting angular displacement thereof and for facing a generator plasma jet; each of the holders being made in the form of a horizontal platform mounted for rotation about an axis passing through a geometric center thereof and perpendicular to a plane of said platform; said plasma jet and wafer holders being displaced with respect to each other and may be in or out of contact with each other; a plasma jet generator located such that a plasma jet is directed in the direction of said horizontal platforms of said wafer holders, each wafer holder being provided with at least one vortex chamber and at least one tangential channel in fluid flow communication between said gas supplying means and said at least one vortex chamber, said chambers defining axes substantially perpendicular to a plane of said horizontal platforms; each of said vortex chambers being provided with an open portion located on a level end surface of the wafer holder, coupled through the tangential channel to said gas supplying means and located such that resulting vortex flows formed permit the positioning of each wafer near the holder and cooling of its individual areas to equalize, over each wafer surface, an amount of energy used for treating the wafer surfaces.

2. A device as defined in claim 1, further comprising a manipulator; storage devices for the wafers to be treated; and a closed chamber having a gas exchange system with the wafer holders and a plasma jet generator located inside said chamber.

3. A device as defined in claim 2, wherein said closed chamber is provided with a window in which a movable shutter is mounted, said manipulator being located to contact with said storage devices directly and with said wafer holder indirectly, through the chamber window.

4. A device as defined in claim 1, wherein said plasma jet generator is mounted on a base on a height adjustable support that allows the treatment temperature to be changed according to desired treatment or processing of said wafers.

5. A device as defined in claim 1, wherein said cooling means comprises a plurality of chambers each in proximity to and open in the direction of a wafer held in a position for treatment, said chambers being connected to said gas supplying means.

6. A device for treating wafers with a plasma jet, comprising a plasma jet generator; gas supplying means, a set of holders for wafers to be treated, said holders having a drive for effecting angular displacement thereof and for facing a generator plasma jet, each of the holders being made in the form of a horizontal platform mounted for rotation about an axis passing through a geometric center thereof and perpendicular to a plane of said platform, said plasma jet and wafer holders being displaced with respect to each other and may be in or out of contact with each other, said plasma jet generator being located such that a plasma jet is directed upwardly in respect of a plane of said horizontal platforms of said wafer holders to maintain the wafers in a suspended state proximate to but out of contact with associated platforms; and cooling means associated with each horizontal platform in fluid flow communication with said gas supplying means and located such that resulting gas flows permit the positioning of the platform near a holder and improve cooling of individual areas over the wafer surfaces while avoiding the need to provide additional cooling of said plasma generator due to natural convection of the hot gases, each wafer holder being provided with at least one vortex chamber and at least one tangential channel in fluid flow communication between said gas supplying means and said at least one vortex chamber.

7. A device as defined in claim 6, wherein said plasma jet generator is mounted on a base on a height adjustable support that allows the treatment temperature to be changed according to desired treatment or processing of said wafers.

8. A device as defined in claim 6, wherein said cooling means comprises a plurality of chambers each in proximity to and open in the direction of a wafer held in a position for treatment, said chambers being connected to said gas supplying means.

9. A device for treating wafers with a plasma jet, comprising a plasma jet generator; gas supplying means; a set of holders for waters to be treated, said holders having a drive for effecting angular displacement thereof and for facing a generator plasma jet; each of the holders being made in the form of a horizontal platform mounted for rotation about an axis passing through a geometric center thereof and perpendicular to a plane of said platform; said plasma jet and wafer holders being displaced with respect to each other and may be in or out of contact with each other, said plasma jet generator being located such that a plasma jet is directed upwardly in respect of a plane of said horizontal platforms of said wafer holders; cooling means associated with each horizontal platform in fluid flow communication with said gas supplying means and located such that resulting gas flows permit the positioning of the platform near a holder and improve cooling of individual areas over the wafer surfaces while avoiding the need to provide additional cooling of said plasma generator due to natural convection of the hot gases; storage devices for the wafers to be treated; a manipulator for manipulating individual wafers in relation to said platforms; and a closed chamber having a gas exchange system with the wafer holders and a plasma jet generator located inside said chamber, each wafer holder being provided with at least one vortex chamber and at least one tangential channel in fluid flow communication between said gas supplying means and said at least one vortex chamber.

10. A device as defined in claim 9, wherein said closed chamber is provided with a window in which a movable shutter is mounted, said manipulator being located to contact with said storage devices directly and with said wafer holder indirectly, through the chamber window.

11. A device for treating wafers with a plasma jet, comprising a plasma jet generator; gas supplying means; a set of holders for wafers to be treated, each having an edge, said holders having a drive for effecting angular displacement thereof and for facing a generator plasma jet, each of the holders being made in the form of a horizontal platform mounted for rotation about an axis passing through a geometric center thereof and being perpendicular to a plane of said platform; said plasma jet and wafer holders being displaced with respect to each other and may be in or out of contact with each other, a plasma jet generator located such that a plasma jet is directed in the direction of said horizontal platforms of said wafer holders, each of the wafer holders being provided with a limiter at the edges and cooling means associated with each horizontal platform in fluid flow communication with said gas supplying means and located such that resulting gas flows permit the positioning of each wafer near a holder and cooling of its individual areas, said limiters on the wafer holder platforms having lengths and being arranged to limit maximum deviation from axisymmetric arrangement of the treated wafers during treatments thereof, each wafer holder being provided with at least one vortex chamber and at least one tangential channel in fluid flow communication between said gas supplying means and said at least one vortex chamber.

12. A device as defined in claim 11, further comprising a manipulator; storage devices for the wafers to be treated; and a closed chamber having a gas exchange system with the wafer holders and a plasma jet generator located inside said chamber.

13. A device as defined in claim 12, wherein said closed chamber is provided with a window in which a movable shutter is mounted, said manipulator being located to contact with said storage devices directly and with said wafer holder indirectly, through the chamber window.

14. A device as defined in claim 11, wherein said limiters on the wafer holder platforms are fabricated as rods mounted at an angle $\alpha > 90°$ to the plane of said horizontal platform of the wafer holder, and their length, l, is chosen such that $$2l \sin(\alpha > 90°) > \Delta,$$

where $\Delta$ denotes a maximum deviation from axisymmetric arrangement of the treated wafers during treatments thereof.

* * * * *